United States Patent
Nagata et al.

(10) Patent No.: US 10,908,626 B2
(45) Date of Patent: Feb. 2, 2021

(54) LINEAR POWER SUPPLY CIRCUIT

(71) Applicant: Rohm Co., Ltd., Kyoto (JP)

(72) Inventors: Takeshi Nagata, Kyoto (JP); Isao Takobe, Koto (JP); Yuhei Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/667,010

(22) Filed: Oct. 29, 2019

(65) Prior Publication Data

US 2020/0133324 A1 Apr. 30, 2020

(30) Foreign Application Priority Data

Oct. 31, 2018 (JP) .................. 2018-205463

(51) Int. Cl.
| | |
|---|---|
| *G05F 1/575* | (2006.01) |
| *B60R 16/03* | (2006.01) |
| *G05F 1/59* | (2006.01) |
| *G05F 3/26* | (2006.01) |
| *H03F 3/21* | (2006.01) |

(52) U.S. Cl.
CPC .............. *G05F 1/575* (2013.01); *B60R 16/03* (2013.01); *G05F 1/59* (2013.01); *G05F 3/262* (2013.01); *H03F 3/21* (2013.01)

(58) Field of Classification Search
CPC . B60R 16/03; G05F 1/46; G05F 1/468; G05F 1/56; G05F 1/561; G05F 1/563; G05F 1/575; G05F 1/59; G05F 1/61; G05F 3/02; G05F 3/08; G05F 3/10; G05F 3/16; G05F 3/20; G05F 3/26; G05F 3/262
See application file for complete search history.

(56) References Cited

U.S. PATENT DOCUMENTS

| | | | |
|---|---|---|---|
| 2004/0104711 A1* | 6/2004 | Scoones ................... | G05F 1/56 323/280 |
| 2008/0157735 A1* | 7/2008 | Liu ......................... | G05F 1/575 323/280 |
| 2008/0174289 A1* | 7/2008 | Gurcan ................... | G05F 1/575 323/280 |

(Continued)

FOREIGN PATENT DOCUMENTS

JP 2003-084843 3/2003

*Primary Examiner* — Levi Gannon
(74) *Attorney, Agent, or Firm* — Fish & Richardson P.C.

(57) ABSTRACT

A linear power supply circuit, includes: output transistor between input terminal where input voltage is applied and output terminal where output voltage is applied; a driver driving the output transistor based on difference between voltage based on the output voltage and reference voltage; and phase compensation circuit, wherein the driver includes differential amplifier outputting voltage corresponding to the difference between the voltage based on the output voltage and the reference voltage, a first capacitance having one end where output of the differential amplifier is applied and the other end where ground potential is applied, a converter converting the voltage based on the output of the differential amplifier into current, and a current amplifier amplifying the current output from the converter, and wherein the phase compensation circuit lowers gain of transfer function of the linear power supply circuit and output capacitor connected to the output terminal.

11 Claims, 6 Drawing Sheets

(56) References Cited

U.S. PATENT DOCUMENTS

| | | | |
|---|---|---|---|
| 2008/0284394 A1* | 11/2008 | Yin | G05F 1/575 |
| | | | 323/282 |
| 2011/0018510 A1* | 1/2011 | Gao | G05F 1/575 |
| | | | 323/280 |
| 2011/0025280 A1* | 2/2011 | Kimura | H03F 1/086 |
| | | | 323/282 |
| 2014/0266104 A1* | 9/2014 | El-Nozahi | G05F 1/575 |
| | | | 323/280 |
| 2016/0266591 A1* | 9/2016 | Hua | G05F 1/445 |
| 2017/0003699 A1* | 1/2017 | Lin | G05F 1/575 |
| 2017/0090494 A1* | 3/2017 | Cui | G05F 1/575 |
| 2019/0113942 A1* | 4/2019 | Murukumpet | H03F 1/0211 |

* cited by examiner

LINEAR POWER SUPPLY CIRCUIT

CROSS-REFERENCE TO RELATED APPLICATION

This application is based upon and claims the benefit of priority from Japanese Patent Application No. 2018-205463, filed on Oct. 31, 2018, the entire contents of which are incorporated herein by reference.

TECHNICAL FIELD

The present disclosure relates to a linear power supply circuit.

BACKGROUND

Linear power supply circuits such as low drop out (LDO) or the like are used as power supply means for various devices.

Further, an example of the aforementioned technology is disclosed in the related art.

It is desirable that linear power supply circuits can respond at a high speed so as to suppress fluctuation of an output voltage to a small level even when a load changes rapidly. It is also desirable that phase compensation can be performed without significantly increasing a circuit area even when a capacitance of an output capacitor is reduced.

SUMMARY

Some embodiments of the present disclosure provide linear power supply circuit capable of providing high-speed response and phase compensation without significantly increasing a circuit area even when a capacitance of an output capacitor is reduced.

According to an aspect of the present disclosure, a liner power circuit is provided. The linear power circuit includes: an output transistor installed between an input terminal to which an input voltage is applied and an output terminal to which an output voltage is applied; a driver configured to drive the output transistor based on a difference between a voltage that is based on the output voltage and a reference voltage; and a phase compensation circuit, wherein the driver includes a differential amplifier configured to output a voltage corresponding to the difference between the voltage based on the output voltage and the reference voltage, a first capacitance having one end to which an output of the differential amplifier is applied and the other end to which a ground potential is applied, a converter configured to convert the voltage that is based on the output of the differential amplifier into a current and output the current, and a current amplifier configured to amplify the current output from the converter, wherein a power supply voltage of the differential amplifier and the converter depends on the output voltage, and wherein the phase compensation circuit is configured to lower a gain of a transfer function of the linear power supply circuit and an output capacitor connected to the output terminal by shifting a pole of the transfer function, without the output capacitor affecting the pole, to a low frequency.

According to another aspect of the present disclosure, a liner power circuit is provided. The linear power circuit includes: an output transistor installed between an input terminal to which an input voltage is applied and an output terminal to which an output voltage is applied; a driver configured to drive the output transistor based on a difference between a voltage based on the output voltage and a reference voltage; and a phase compensation circuit, wherein the driver includes a differential amplifier configured to output a voltage corresponding to the difference between the voltage based on the output voltage and the reference voltage, a first capacitance having one end to which an output of the differential amplifier is applied and the other end to which the voltage that is based on the output voltage is applied to, a converter configured to convert the voltage that is based on the output of the differential amplifier into a current and output the current, and a current amplifier configured to amplify the current output from the converter, and a phase compensation circuit, wherein a power supply voltage of the differential amplifier is a first constant voltage and a power supply voltage of the current amplifier is a second constant voltage, or the power supply voltage of the differential amplifier and the power supply voltage of the current amplifier are the input voltage, and wherein the phase compensation circuit is configured to lower a gain of a transfer function of the linear power supply circuit and an output capacitor connected to the output terminal by shifting a pole of the transfer function, without the output capacitor affecting the pole, to a low frequency.

In some embodiments, the phase compensation circuit may include: a second transistor connected in parallel to a first transistor which is one of the output transistor and a transistor in the driver; a resistor installed between a control terminal of the first transistor and a control terminal of the second transistor; and a second capacitance installed between the control terminal of the second transistor and a first terminal.

In some embodiments, the second capacitance may be a parasitic capacitance of the second transistor.

In some embodiments, the first transistor may be the output transistor.

In some embodiments, a size of the second transistor may be larger than a size of the first transistor.

In some embodiments, the power supply voltage of the current amplifier may be a constant voltage.

In some embodiments, withstand voltages of the differential amplifier and the converter may be lower than a withstand voltage of the current amplifier.

In some embodiments, a gain of the differential amplifier may be smaller than a gain of the current amplifier.

In some embodiments, the current amplifier may include a plurality of current sink type current mirror circuits and a plurality of current source type current mirror circuits, wherein a mirror ratio of each of the plurality of current sink type current mirror circuits is 5 or less, and wherein a mirror ratio of each of the plurality of current source type current mirror circuits is 5 or less.

According to another aspect of the present disclosure, a vehicle including the linear power supply circuit is provided.

DETAILED DESCRIPTION

Embodiments of the present disclosure will now be described in detail with reference to the drawings.

1. Linear Power Supply Circuit Capable of High-Speed Response

Figure 1:
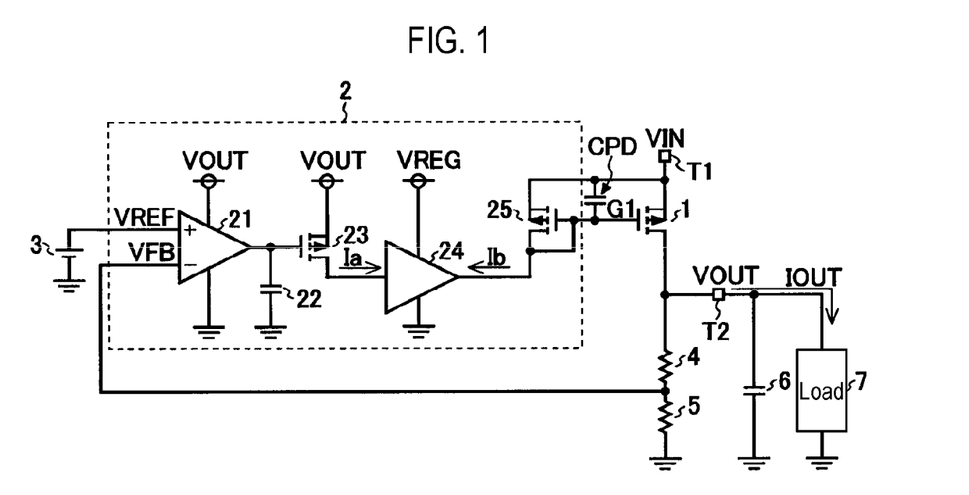
FIG. 1 is a diagram illustrating a configuration of a linear power supply circuit developed by the present inventors.

FIG. 1 is a diagram illustrating a configuration of a linear power supply circuit developed by the present inventors as a linear power supply circuit capable of high-speed response. The linear power supply circuit illustrated in FIG. 1 includes an input terminal T1, an output terminal T2, an output transistor 1, a driver 2, a reference voltage generation part 3, and resistors 4 and 5.

An output capacitor 6 and a load 7 are externally attached to the linear power supply circuit illustrated in FIG. 1. Specifically, the output capacitor 6 and the load 7 are externally connected in parallel to the output terminal T2. The linear power supply circuit illustrated in FIG. 1 steps down an input voltage VIN to generate an output voltage VOUT, and supplies the output voltage VOUT to the load 7.

The output transistor 1 is installed between the input terminal T1 to which the input voltage VIN is applied and the output terminal T2 to which the output voltage VOUT is applied.

The driver 2 drives the output transistor 1. Specifically, the driver 2 drives the output transistor 1 by supplying a gate signal G1 to a gate of the output transistor 1. The conductivity (conversely, an on resistance value) of the output transistor 1 is controlled by the gate signal G1. Furthermore, in the configuration illustrated in FIG. 1, a p-channel type MOSFET (PMOSFET) is used as the output transistor 1. Therefore, as the gate signal G1 decreases, the conductivity of the output transistor 1 increases and the output voltage VOUT increases. Conversely, as the gate signal G1 increases, the conductivity of the output transistor 1 decreases and the output voltage VOUT decreases. However, instead of the PMOSFET as the output transistor 1, an NMOSFET may be used or a bipolar transistor may be used.

The reference voltage generation part 3 generates a reference voltage VREF. The resistors 4 and 5 generate a feedback voltage VFB which is a divided voltage of the output voltage VOUT.

The reference voltage VREF is applied to a non-inverting input terminal (+) of the driver 2, and the feedback voltage VFB is applied to an inverting input terminal (−) of the driver 2. The driver 2 drives the output transistor 1 based on a difference value ΔV (=VFB−VREF) between the feedback voltage VFB and the reference voltage VREF. The driver 2 increases the gate signal G1 as the difference value ΔV increases, and conversely decreases the gate signal G1 as the difference value ΔV decreases.

The driver 2 includes a differential amplifier 21, a capacitance 22, a PMOSFET 23, a current amplifier 24, and a PMOSFET 25.

The differential amplifier 21 outputs a voltage corresponding to the difference between the feedback voltage VFB and the reference voltage VREF. A power supply voltage of the differential amplifier 21 is the output voltage VOUT. That is, the differential amplifier 21 is driven by a voltage between the output voltage VOUT and a ground potential. Also, instead of the output voltage VOUT, a voltage, which is lower than the output voltage VOUT and is dependent on the output voltage VOUT, may be used as the power supply voltage of the differential amplifier 21.

A withstand voltage of the differential amplifier 21 is lower than that of the current amplifier 24. In addition, the gain of the differential amplifier 21 is smaller than the gain of the current amplifier 24. Thus, the differential amplifier 21 can be miniaturized.

An output of the differential amplifier 21 is applied to one end of the capacitance 22, and the ground potential is applied to the other end of the capacitance 22.

The output voltage VOUT is applied to a source of the PMOSFET 23, and a voltage that is based on the output of the differential amplifier 21 (a connection node voltage between the differential amplifier 21 and the capacitance 22) is applied to a gate of the PMOSFET 23. The PMOSFET 23 converts the voltage that is based on the output of the differential amplifier 21 into a current and outputs the current from its drain. Since the connection node between the differential amplifier 21 and the capacitance 22 is grounded in a high frequency band, a high-speed response of the driver 2 may be realized.

The current amplifier 24 amplifies a current Ia output from the drain of the PMOSFET 23. A power supply voltage of the current amplifier 24 is a constant voltage VREG. That is, the current amplifier 24 is driven by a voltage between the constant voltage VREG and the ground potential.

The PMOSFET 25 constitutes a current mirror circuit together with the output transistor 1. The PMOSFET 25 converts a current Ib output from the current amplifier 24 into a voltage and applies it to the gate of the output transistor 1.

Figure 2:
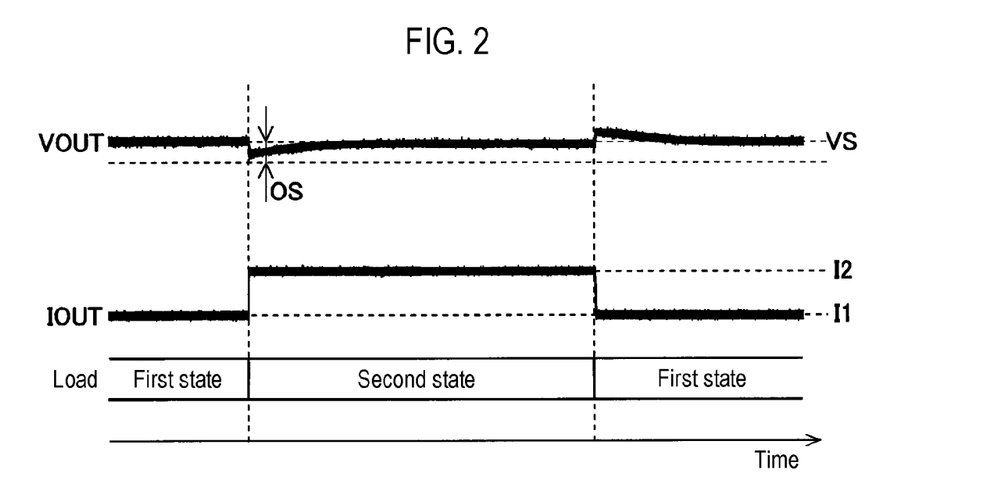
FIG. 2 is a time chart illustrating output characteristics of the linear power supply circuit shown in FIG. 1.

FIG. 2 is a time chart illustrating output characteristics of the linear power supply circuit shown in FIG. 1. FIG. 2 is a time chart when the load 7 is switched from a first state to a second state and then is again returned to the first state in a state where a set value of the output voltage VOUT is VS and the capacitance of the output capacitor 6 has a predetermined value. The first state is a light load state where a theoretical value of an output current IOUT becomes I1, and the second state is a heavy load state where the theoretical value of the output current IOUT becomes I2 (where I2>I1).

Since the linear power supply circuit illustrated in FIG. 1 can respond at a high speed, an amount of overshoot OS can be reduced.

Figure 3:
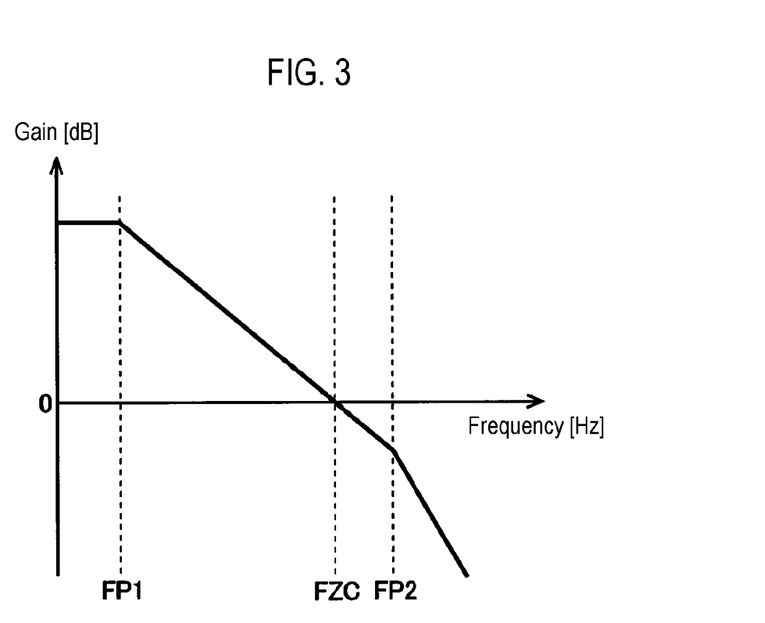
FIG. 3 is a diagram illustrating gain characteristics of a transfer function of the linear power supply circuit and an output capacitor shown in FIG. 1.

FIG. 3 is a diagram illustrating gain characteristics of a transfer function of the linear power supply circuit and the output capacitor 6 shown in FIG. 1. A first pole frequency FP1 is a first pole frequency generated by the output capacitor 6. A second pole frequency FP2 is a second pole frequency generated by parasitic capacitance CPD formed between a source and the gate of the output transistor 1.

In the transfer function illustrated in FIG. 3, since the first pole frequency FP1 and the second pole frequency FP2 are sufficiently separated from each other, phase compensation is easily performed.

Figure 4:
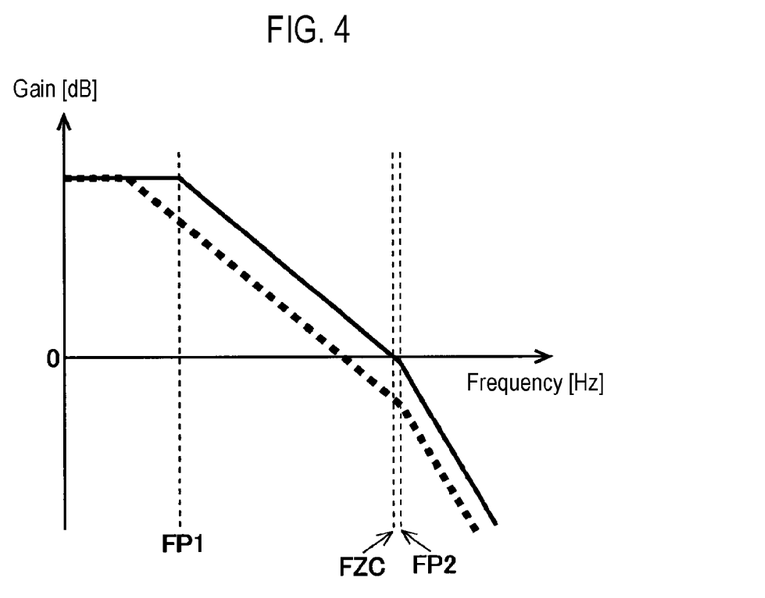
FIG. 4 is a diagram illustrating gain characteristics of the transfer function of the linear power supply circuit and the output capacitor shown in FIG. 1.

However, when the capacitance of the output capacitor 6 is reduced, the first pole is shifted to a high frequency so that the gain characteristics of the transfer function of the linear power supply circuit and the output capacitor 6 illustrated in FIG. 1 are as indicated in FIG. 4. Furthermore, in FIG. 4, the gain characteristics illustrated in FIG. 3 are indicated by a thick dotted line for comparison.

In the gain characteristics illustrated in FIG. 4, as the first pole is shifted to a high frequency, a zero-cross frequency FZC is also shifted to the high frequency, and the zero-cross frequency FZC approaches the second pole frequency FP2, which makes phase compensation difficult. On the other hand, when the internal circuit of the linear power supply circuit illustrated in FIG. 1 is improved so that the first pole frequency FP1 and the second pole frequency FP2 are sufficiently separated from each other even when the capacitance of the output capacitor 6 is reduced, a circuit area of the linear power supply circuit illustrated in FIG. 1 may be substantially increased.

2. First Embodiment

Figure 5:
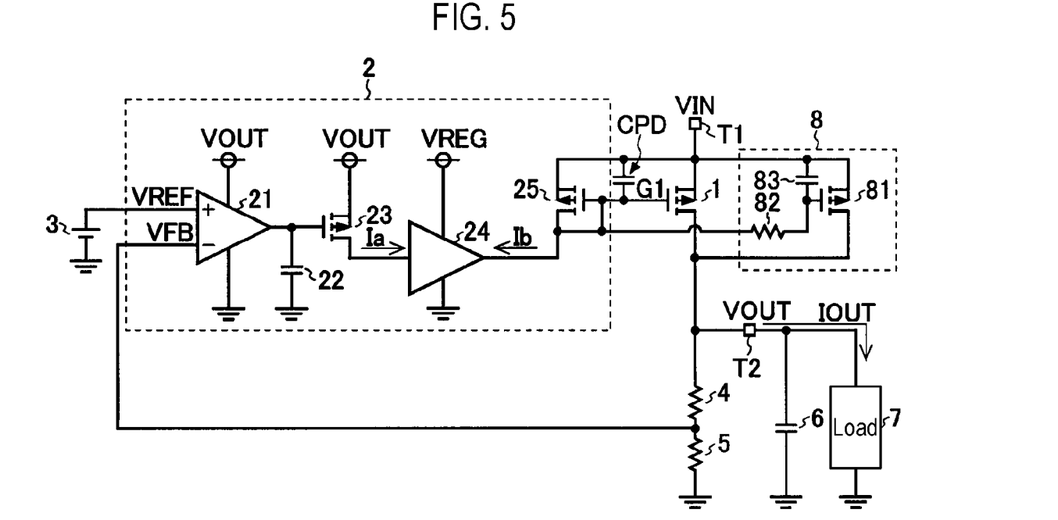
FIG. 5 is a diagram illustrating a configuration of a linear power supply circuit according to a first embodiment of the present disclosure.

FIG. 5 is a diagram illustrating a first embodiment of a linear power supply circuit developed by the present inventors in order to solve the problems of the linear power supply circuit shown in FIG. 1. In FIG. 5, the same parts as those in FIG. 1 are denoted by the same reference numerals and a detailed description thereof will be omitted.

The linear power supply circuit illustrated in FIG. 5 is different from the linear power supply circuit illustrated in FIG. 1 in that it includes a phase compensation circuit 8.

Similar to the linear power supply circuit illustrated in FIG. 1, the linear power supply circuit illustrated in FIG. 5 can realize a high-speed response of the driver 2 because the connection node between the differential amplifier 21 and the capacitance 22 is grounded in the high frequency band.

The withstand voltages of the differential amplifier 21 and the PMOSFET 23 are lower than the withstand voltage of the current amplifier 24. In addition, the gain of the differential amplifier 21 is smaller than the gain of the current amplifier 24. Thus, the differential amplifier 21 and the PMOSFET 23 can be miniaturized.

The withstand voltage of the PMOSFET 23 is lower than the withstand voltage of the current amplifier 24. Thus, the PMOSFET 23 can be miniaturized.

Figure 6:
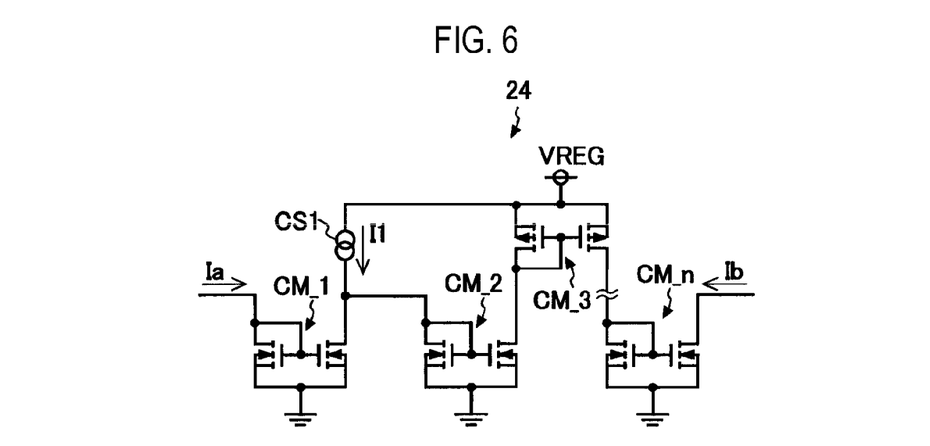
FIG. 6 is a diagram illustrating a first configuration example of a current amplifier.

FIG. 6 is a diagram illustrating a configuration example of the current amplifier 24. The current amplifier 24 includes current sink type current mirror circuits CM_1, CM_2, . . . , and CM_n, and current source type current mirror circuits CM_3, . . . , and CM_n−1 (where CM_n−1 is not shown in FIG. 6). The current sink type current mirror circuits and the current source type current mirror circuits are alternately arranged from the input to the output of the current amplifier 24 between, on one hand, the current sink type current mirror circuit CM_1 and a constant current source CS1 for allowing the constant current I1 to flow and, on the other hand, the current sink type current mirror circuit CM_n. In order to keep the pole generated in each current mirror circuit from approaching the low band as much as possible, a mirror ratio of each current mirror circuit (a ratio of a size of an output-side transistor to a size of an input-side transistor) may be 5 or less in some embodiments, or may be 3 or less in some embodiments. However, since the circuit area of the current amplifier 24 increases as the mirror ratio of each current mirror circuit decreases, the mirror ratio of each current mirror circuit may be determined in consideration of trade-off between improvement in frequency characteristics and miniaturization.

Referring back to FIG. 5, a configuration of the phase compensation circuit 8 will be described. The phase compensation circuit 8 includes a PMOSFET 81, a resistor 82, and a capacitance 83.

The PMOSFET 81 is connected in parallel to the output transistor 1. That is, a source of the PMOSFET 81 is connected to the source of the output transistor 1, and a drain of the PMOSFET 81 is connected to the drain of the output transistor 1. In the present embodiment, the size of the PMOSFET 81 is set larger than the size of the output transistor 1 so that the current flowing through the PMOSFET 81 is larger than the current flowing through the output transistor 1.

One end of the resistor 82 is connected to each of the gates of the output transistor 1 and the PMOSFET 25, and the other end of the resistor 82 is connected to a gate of the PMOSFET 81.

The capacitance 83 is installed between the gate and the source of the PMOSFET 81. In the present embodiment, a parasitic capacitance of the PMOSFET 81 is used as the capacitance 83. The phase compensation circuit 8 may further include a capacitance installed between the gate and the drain of the PMOSFET 81.

Figure 7:
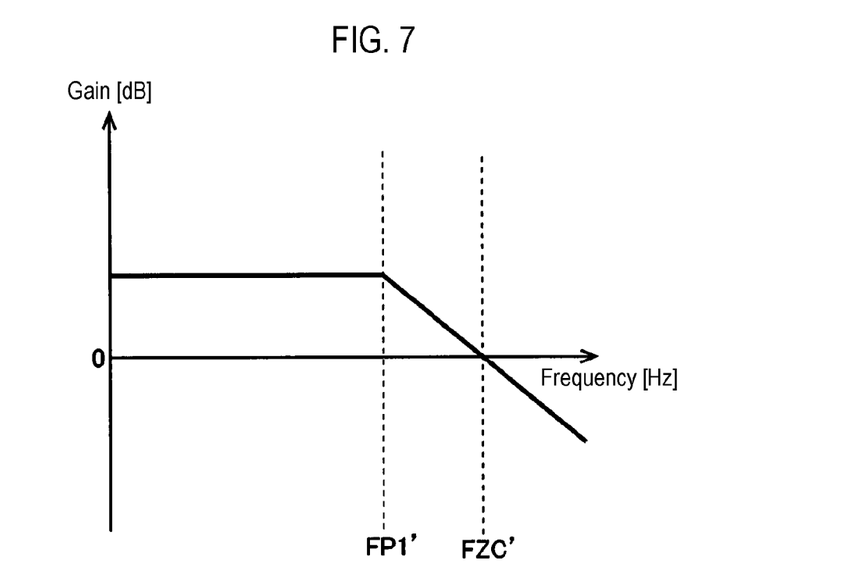
FIG. 7 is a diagram illustrating gain characteristics of a transfer function of an output transistor.

Next, a function of the phase compensation circuit 8 will be described with reference to FIGS. 7 and 8. FIG. 7 is a diagram illustrating gain characteristics of the transfer function of the output transistor 1. A first pole frequency FP1' is a first pole frequency generated by the parasitic capacitance CPD. The first pole of the transfer function of the output transistor 1 is a pole which the output capacitor 6 does not affect.

Figure 8:
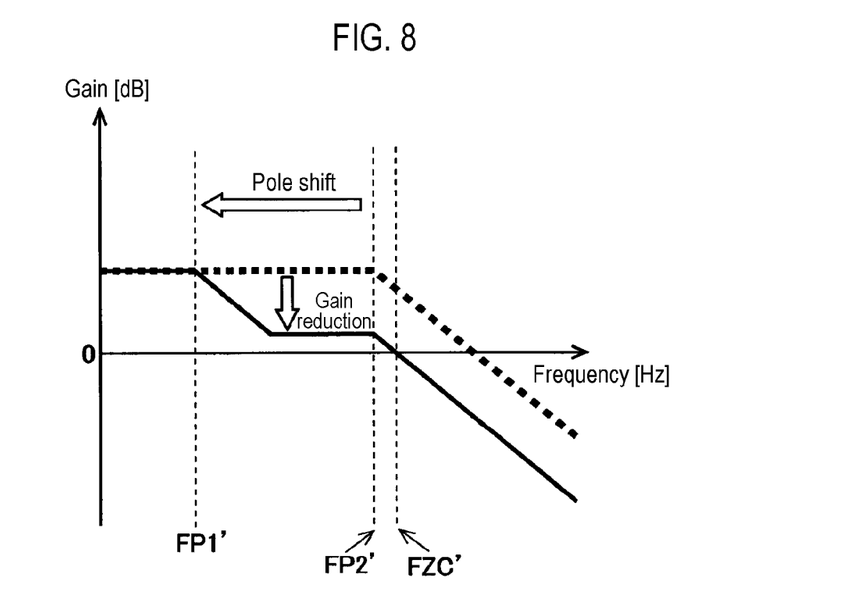
FIG. 8 is a diagram illustrating gain characteristics of a transfer function of the output transistor and a phase compensation circuit.

FIG. 8 is a diagram illustrating gain characteristics of the transfer function of the output transistor 1 and the phase compensation circuit 8. Furthermore, in FIG. 8, the gain characteristics illustrated in FIG. 7 are indicated by a thick dotted line for comparison.

The current flows through the PMOSFET 81 in which a CR circuit (the resistor 82 and the capacitance 83) is connected to its gate, so that the first pole frequency FP1' is shifted to a low frequency as compared to a case where the phase compensation circuit 8 does not exist (see FIG. 7). By shifting the first pole frequency FP1' to the low frequency, the gain of a higher frequency than the first pole frequency FP1' is lowered as compared with the case where the first pole frequency FP1' is not shifted to the low frequency.

In addition, since the PMOSFET 81 and the output transistor 1 are connected in parallel and thus the output transistor 1 is not affected by the resistor 82, the pole also exists at the original position before the first pole frequency FP1' is shifted to the low frequency. Therefore, the frequency of that pole becomes a second pole frequency FP2'. A zero-cross frequency FZC' is shifted to the low frequency as the first pole frequency FP1' is shifted to the low frequency and the gain decreases.

The first pole frequency FP1' and the second pole frequency FP2' are related to the second pole frequency of the transfer function of the linear power supply circuit and the output capacitor 6 illustrated in FIG. 5. Therefore, the phase compensation circuit 8 can shift the second pole frequency of the transfer function of the linear power supply circuit and the output capacitor 6 illustrated in FIG. 5 to a lower frequency as compared to the case where the phase compensation circuit 8 does not exist (see FIG. 4). Then, according to such shift, the phase compensation circuit 8 can lower the gain of the transfer function of the linear power supply circuit and the output capacitor 6 illustrated in FIG. 5 at a higher frequency than the second pole frequency of the transfer function of the linear power supply circuit and the output capacitor 6 illustrated in FIG. 5, as compared to the case where the phase compensation circuit 8 does not exist (see FIG. 4). As a result, the zero-cross frequency of the transfer function of the linear power supply circuit and the output capacitor 6 illustrated in FIG. 5 is shifted to a low frequency. That is, the linear power supply circuit illustrated in FIG. 5 can perform phase compensation only by adding the phase compensation circuit 8 (without significantly increasing the circuit area) even when the capacitance of the output capacitor 6 is reduced.

3. Second Embodiment

Figure 9A:
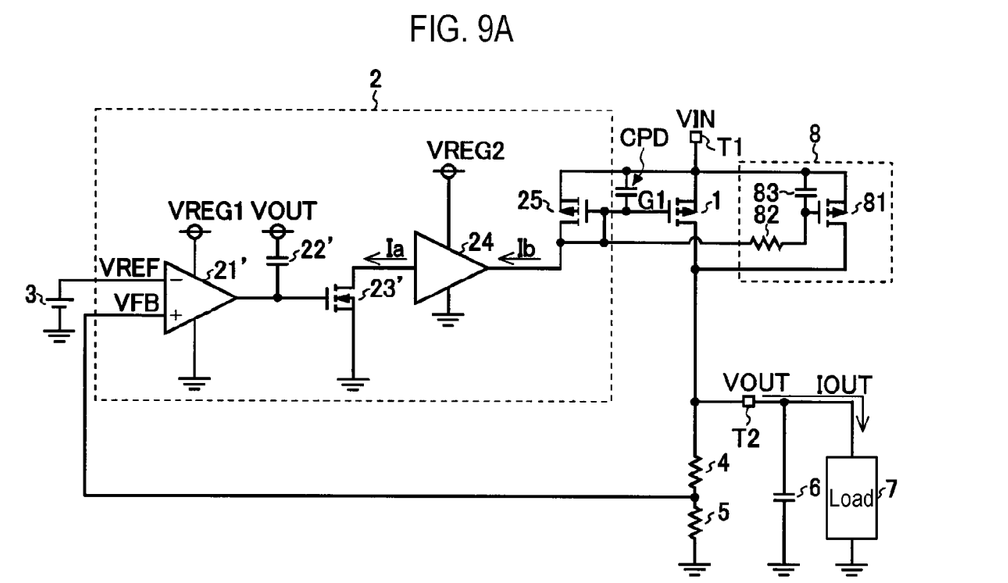
FIG. 9A is a diagram illustrating a configuration of a linear power supply circuit according to a second embodiment of the present disclosure.

FIG. 9A is a diagram illustrating a configuration of a linear power supply circuit according to a second embodiment of the present disclosure. In FIG. 9A, the same parts as those in FIG. 5 are denoted by the same reference numerals and a detailed description thereof will be omitted.

In the present embodiment, the driver 2 includes a differential amplifier 21', a capacitance 22', an NMOSFET 23', a current amplifier 24, and a PMOSFET 25.

The differential amplifier 21' outputs a voltage corresponding to a difference between a feedback voltage VFB and a reference voltage VREF. A power supply voltage of the differential amplifier 21' is a first constant voltage VREG1. That is, the differential amplifier 21' is driven by a voltage between the first constant voltage VREG1 and a ground potential.

Withstand voltages of the differential amplifier 21' and the NMOSFET 23' are lower than the withstand voltage of the current amplifier 24. The gain of the differential amplifier 21' is smaller than the gain of the current amplifier 24. Thus, the differential amplifier 21' and the NMOSFET 23' can be miniaturized.

An output of the differential amplifier 21' is applied to one end of the capacitance 22', and an output voltage VOUT is applied to the other end of the capacitance 22'. Also, instead of the output voltage VOUT, a voltage depending on the output voltage VOUT may be applied to the other end of the capacitance 22.

The ground potential is applied to a source of the NMOSFET 23', and a voltage that is based on the output of the differential amplifier 21' (a connection node voltage between the differential amplifier 21' and the capacitance 22') is applied to a gate of the NMOSFET 23'. The NMOSFET 23' converts the voltage that is based on the output of the differential amplifier 21' into a current and outputs the same from its drain. Since the connection node between the differential amplifier 21' and the capacitance 22' is grounded to the output voltage VOUT in a high frequency band, a high-speed response of the driver 2 may be realized.

Figure 9B:
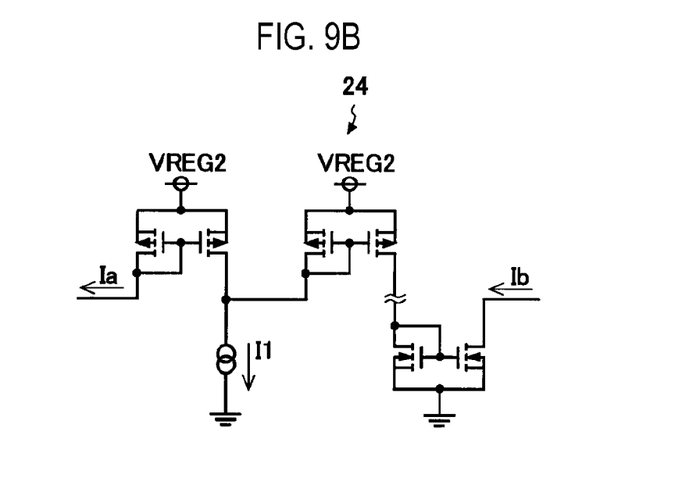
FIG. 9B is a diagram illustrating another configuration example of the current amplifier

The current amplifier 24 amplifies a current Ia output from a drain of the NMOSFET 23'. A power supply voltage of the current amplifier 24 is a second constant voltage VREG2. That is, the current amplifier 24 is driven by a voltage between the second constant voltage VREG2 and the ground potential. The first constant voltage VREG1 and the second constant voltage VREG2 may be the same value or different values. In this configuration example, since the current Ia flows from the current amplifier 24 toward the NMOSFET 23', the current amplifier 24 may have, for example, a circuit configuration illustrated in FIG. 9B.

The linear power supply circuit according to the present embodiment illustrated in FIG. 9A may obtain the same effects as those of the linear power supply circuit according to the first embodiment illustrated in FIG. 5. Furthermore, the linear power supply circuit according to the present embodiment illustrated in FIG. 9A can ensure operation of the differential amplifier 21' even when a set value of the output voltage VOUT is low. In addition, when the low voltage is used as the input voltage VIN, the input voltage VIN may be used as the power supply voltage of the differential amplifier 21' instead of the first constant voltage VREG1, and the input voltage VIN may be used as the power supply voltage of the current amplifier 24 instead of the second constant voltage VREG2.

4. Applications

Figure 10:
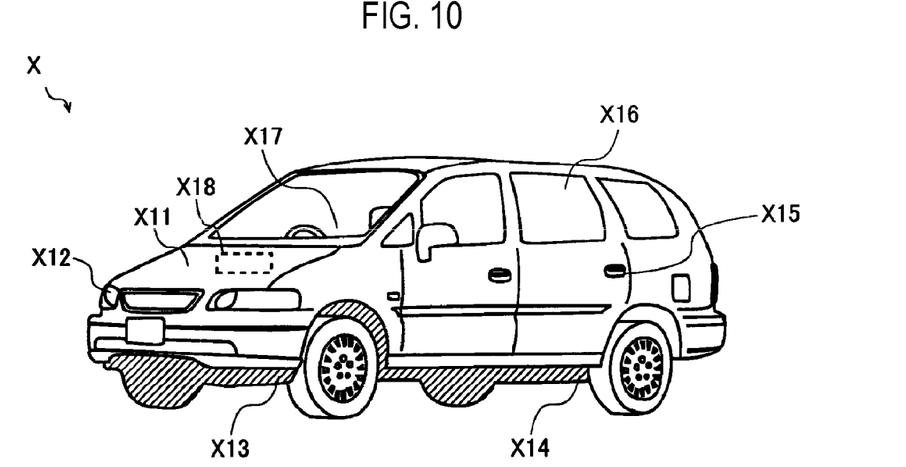
FIG. 10 is an external view of a vehicle.

FIG. 10 is an external view of a vehicle X. The vehicle X of this configuration example is equipped with various electronic devices X11 to X18 that operate by receiving a voltage output from a battery (not shown). Furthermore, mounting positions of the electronic devices X11 to X18 in this drawing may be different from the actual positions for convenience of illustration.

The electronic device X11 is an engine control unit that performs controls (injection control, electronic throttle control, idling control, oxygen sensor heater control, auto cruise control, or the like) related to an engine.

The electronic device X12 is a lamp control unit that performs lighting on/off controls of a high intensity discharged lamp (HID), a daytime running lamp (DRL), or the like.

The electronic device X13 is a transmission control unit that performs controls related to a transmission.

The electronic device X14 is a braking unit that performs controls (anti-lock brake system (ABS) control, electric power steering (EPS) control, electronic suspension control, and the like) related to a motion of the vehicle X.

The electronic device X15 is a security control unit that performs drive controls such as a door lock, an anti-theft alarm, or the like.

The electronic device X16 is an electronic device incorporated in the vehicle X at the factory shipment stage as a standard equipment item or manufacturer's option product such as a wiper, an electric door mirror, a power window, a damper (shock absorber), an electric sunroof, an electric seat, or the like.

The electronic device X17 is an electronic device that is optionally mounted on the vehicle X as a user option product, such as an in-vehicle audio/visual (A/V) device, a car navigation system, an electronic toll collection system (ETC), or the like.

The electronic device X18 is an electronic device including a high withstand voltage motor such as an in-vehicle blower, an oil pump, a water pump, a battery cooling fan, or the like.

The linear power supply circuit described above may also be incorporated in any of the electronic devices X11 to X18.

5. Others

The aforementioned embodiments should be considered to be illustrative in all respects and not restrictive, and the technical scope of the present disclosure is not limited to the description of the aforementioned embodiments but is defined by the accompanying claims, and is therefore to be understood to include all modifications that belong to the meaning and scope equivalent to the claims.

Figure 11:
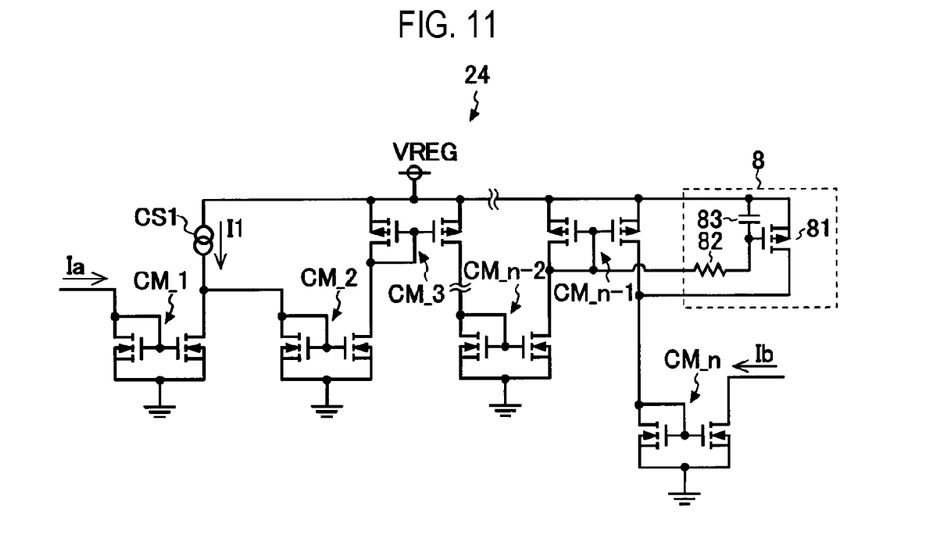
FIG. 11 is a diagram illustrating a principal part of a modification of the linear power supply circuit.

For example, in the first and second embodiments described above, the gain reduction by the phase compensation circuit 8 is increased by connecting the PMOSFET 81 in the phase compensation circuit 8 in parallel to the output transistor 1 and making the size of the PMOSFET 81 larger than the size of the output transistor 1. However, the PMOSFET 81 may be connected in parallel to the transistor in the driver 2 instead of the output transistor 1. For example, as illustrated in FIG. 11, the PMOSFET 81 may be connected in parallel to the PMOSFET constituting the current mirror circuit CM_n-1 in the current amplifier 24. Even in this case, from the viewpoint of increasing the gain reduction by the phase compensation circuit 8, the size of the PMOSFET 81 may be larger than the size of the PMOSFET constituting the current mirror circuit CM_n-1 in the current amplifier 24, in some embodiments.

The phase compensation circuit may be a circuit capable of lowering the gain of the transfer function of the linear power supply circuit and the output capacitor by shifting a pole, which the output capacitor does not affect and which is a pole of the transfer function of the linear power supply circuit and the output capacitor, to a low frequency, and is not limited to the specific circuit configuration of the phase compensation circuit 8 which is merely an example.

According to the present disclosure in some embodiments, it is possible to provide a linear power supply circuit capable of high-speed response and phase compensation without substantially increasing a circuit area even when a capacitance of an output capacitor is reduced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A linear power supply circuit, comprising:
   an output transistor installed between an input terminal to which an input voltage is applied and an output terminal to which an output voltage is applied;
   a driver configured to drive the output transistor based on a difference between a voltage that is based on the output voltage and a reference voltage; and
   a phase compensation circuit,
   wherein the driver includes a differential amplifier configured to output a voltage corresponding to the difference between the voltage based on the output voltage and the reference voltage, a first capacitance having one end to which an output of the differential amplifier is applied and the other end to which a ground potential is applied, a converter configured to convert the voltage that is based on the output of the differential amplifier into a current and output the current, and a current amplifier configured to amplify the current output from the converter,
   wherein a power supply voltage of the differential amplifier and the converter depends on the output voltage, and
   wherein the phase compensation circuit is configured to lower a gain of a transfer function of the linear power supply circuit and an output capacitor connected to the output terminal by shifting a pole of the transfer function, without the output capacitor affecting the pole, to a low frequency.

2. The circuit of claim 1, wherein the phase compensation circuit includes:
   a second transistor connected in parallel to a first transistor which is one of the output transistor and a transistor in the driver;
   a resistor installed between a control terminal of the first transistor and a control terminal of the second transistor; and
   a second capacitance installed between the control terminal of the second transistor and a first terminal.

3. The circuit of claim 2, wherein the second capacitance is a parasitic capacitance of the second transistor.

4. The circuit of claim 2, wherein the first transistor is the output transistor.

5. The circuit of claim 2, wherein a size of the second transistor is larger than a size of the first transistor.

6. The circuit of claim 1, wherein the power supply voltage of the current amplifier is a constant voltage.

7. The circuit of claim 6, wherein withstand voltages of the differential amplifier and the converter are lower than a withstand voltage of the current amplifier.

8. The circuit of claim 1, wherein a gain of the differential amplifier is smaller than a gain of the current amplifier.

9. The circuit of claim 1, wherein the current amplifier includes a plurality of current sink type current mirror circuits and a plurality of current source type current mirror circuits,
   wherein a mirror ratio of each of the plurality of current sink type current mirror circuits is 5 or less, and
   wherein a mirror ratio of each of the plurality of current source type current mirror circuits is 5 or less.

10. A vehicle comprising the linear power supply circuit of claim 1.

11. A linear power supply circuit, comprising:
    an output transistor installed between an input terminal to which an input voltage is applied and an output terminal to which an output voltage is applied;
    a driver configured to drive the output transistor based on a difference between a voltage based on the output voltage and a reference voltage; and
    a phase compensation circuit,
    wherein the driver includes a differential amplifier configured to output a voltage corresponding to the difference between the voltage based on the output voltage and the reference voltage, a first capacitance having one end to which an output of the differential amplifier is applied and the other end to which the voltage that is based on the output voltage is applied to, a converter configured to convert the voltage that is based on the output of the differential amplifier into a current and output the current, and a current amplifier configured to amplify the current output from the converter, and,
    wherein a power supply voltage of the differential amplifier is a first constant voltage and a power supply voltage of the current amplifier is a second constant voltage, or the power supply voltage of the differential amplifier and the power supply voltage of the current amplifier are the input voltage, and
    wherein the phase compensation circuit is configured to lower a gain of a transfer function of the linear power supply circuit and an output capacitor connected to the output terminal by shifting a pole of the transfer function, without the output capacitor affecting the pole, to a low frequency.

* * * * *